United States Patent
Lee et al.

(10) Patent No.: US 7,315,480 B2
(45) Date of Patent: Jan. 1, 2008

(54) REDUNDANCY SELECTOR CIRCUIT FOR USE IN NON-VOLATILE MEMORY DEVICE

(75) Inventors: You-Sang Lee, Seoul (KR); Sang-Won Hwang, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/444,353

(22) Filed: Jun. 1, 2006

(65) Prior Publication Data

US 2007/0019483 A1 Jan. 25, 2007

(30) Foreign Application Priority Data

Jul. 22, 2005 (KR) .................. 10-2005-0066884

(51) Int. Cl.
*G11C 7/00* (2006.01)
*G11C 8/00* (2006.01)

(52) U.S. Cl. .............. 365/200; 365/189.05; 365/189.07

(58) Field of Classification Search ................ 365/200, 365/189.05, 189.07, 189.02, 225.7
See application file for complete search history.

(56) References Cited

U.S. PATENT DOCUMENTS 5,206,831 A * 4/1993 Wakamatsu .................. 365/200
6,426,910 B1 7/2002 Santin
6,532,181 B2 * 3/2003 Saito et al. .................. 365/200
2002/0012282 A1 * 1/2002 Saito et al. .................. 365/200

FOREIGN PATENT DOCUMENTS

| JP | 2004-515868 | 5/2004 |
| JP | 2004-246958 | 9/2004 |
| KR | 10-1999-0080912 | 11/1999 |
| KR | 10-20030024921 | 3/2003 |

* cited by examiner

*Primary Examiner*—Son Dinh
(74) *Attorney, Agent, or Firm*—Volentine & Whitt, PLLC

(57) ABSTRACT

A redundancy selector circuit for use in a non-volatile memory device include a ROM cell array, in which defective addresses are stored, including a plurality of ROM cells arranged in a matrix of rows and columns; a ROM controller for sequentially selecting rows of the ROM cell array at power-up; a sense amplifier block for sensing and amplifying data bits from ROM cells of the respective rows selected sequentially according to the control of the ROM controller; a latch block for receiving data bits sensed by the sense amplifier block through a switch circuit and latching the input data bits as a defective address; and a comparator block for detecting whether an address input in a normal operation matches one of the defective addresses stored in the latch block. As the rows are sequentially selected, the defective addresses of the ROM cell array are transferred to the latch block through the sense amplifier block by means of serial transfer.

7 Claims, 4 Drawing Sheets

REDUNDANCY SELECTOR CIRCUIT FOR USE IN NON-VOLATILE MEMORY DEVICE

BACKGROUND

1. Field of the Disclosure

The disclosed methods and systems relate to a semiconductor integrated circuit and, more particularly, to a non-volatile memory device with a redundancy selector circuit.

2. Discussion of Related Art

Memory devices are integrated circuits capable of storing and later retrieving data. Generally, a memory device includes a plurality of memory cells each storing one or more bits of data. Unfortunately, memory cells may be defective due to a number of reasons, such as an unstable fabrication process or degradation resulting from lapse of time. Accordingly, a given memory device may not ever operate properly and/or its reliability may deteriorate over time.

However, in order to increase production yield, many approaches have been devised to overcome problems caused by infrequent defective memory cells without altogether discarding the memory devices containing the defects. One of these approaches is to incorporate redundancy circuits in a memory device. The redundancy circuits generally have a plurality of defect-free memory cells to logically (not physically) replace known defective memory cells. Exemplary redundancy circuits are disclosed in U.S. Pat. No. 6,118,712 entitled "REDUNDANCY FUSE BOXES AND REDUNDANCY REPAIR STRUCTURES FOR SEMICONDUCTOR DEVICES" and U.S. Pat. No. 6,850,450 entitled "FUSE BOX INCLUDING MAKE-LINK AND REDUNDANT ADDRESS DECODER HAVING THE SAME AND METHOD FOR REPAIRING DEFECTIVE MEMORY CELL", both of which are incorporated herein by reference in their entirety.

Redundancy circuits often store addresses of defective memory cells in a fuse circuit by selectively cutting fuses within the fuse circuit. Accordingly, during normal operation of the memory device using the redundancy circuits, addresses input to the memory device (or addresses generated internally) are compared to each stored defective memory address and, based on the comparison result, a redundant memory cell may be selected in place of a defective memory cell.

Unfortunately, a shortfall of this form of memory repair arises when the operating speed of the memory device inadvertently causes a defective memory cell to be selected instead of the functional redundant memory cell. That is, because of the inherent delays of all electronic circuitry, a redundancy checking circuit may fail to timely recognize that an address represents a defective memory cell, and the appropriate redundant memory cells may not be activated if the operating speed of the memory device exceeds the requisite set-up time needed to ensure proper operation of the redundancy checking circuit. The alternative is to use longer set-up times, thus slowing the overall operating speed of the memory device. Accordingly, new methods and systems relating to redundancy circuitry for memory devices are desirable.

SUMMARY OF THE DISCLOSURE

Exemplary embodiments of the disclosed methods and systems are directed to a redundancy selector circuit for use in a non-volatile memory device.

In an exemplary embodiment, aa redundancy selector circuit for use in a flash memory device can include a ROM cell array that includes a plurality of ROM cells arranged in a matrix of rows and columns for storing defective addresses of the flash memory device, a ROM controller for sequentially selecting rows of the ROM cell array at power-up, a sense amplifier block for sensing data bits from ROM cells selected by the ROM controller, wherein the data bits represent one or more defective addresses of the flash memory device, a latch block for serially receiving the defective address data bits sensed by the sense amplifier block through a switch circuit, and subsequently latching the serially input defective address data bits and a comparator block for detecting whether an address input in a normal operation of the flash memory device matches one of the one or more defective addresses stored in the latch block.

In a second embodiment, a redundancy selector circuit for use in a non-volatile memory device can include a ROM cell array that includes a plurality of ROM cells arranged in a matrix of rows and columns for storing defective addresses of the non-volatile memory device, a ROM controller for sequentially selecting rows of the ROM cell array at power-up, a sense amplifier block for sensing data bits from ROM cells selected by the ROM controller, wherein the data bits represent one or more defective addresses of the non-volatile memory device, a latch block for receiving the defective address data bits sensed by the sense amplifier block through a switch circuit, and subsequently latching the input defective address data bits and a comparator block for detecting whether an address input in a normal operation of the non-volatile memory device matches one of the one or more defective addresses stored in the latch.

DETAILED DESCRIPTION

Various embodiments of the disclosed methods and systems will be described below in more detail with reference to the accompanying drawings. The disclosed methods and systems may, however, be embodied in different forms and should not be constructed as limited to the embodiments set forth herein. Rather, these embodiments are provided so that this disclosure will be thorough and complete, and will fully convey the scope of the disclosure to those skilled in the art. Like numerals refer to like elements throughout the specification.

Figure 1:
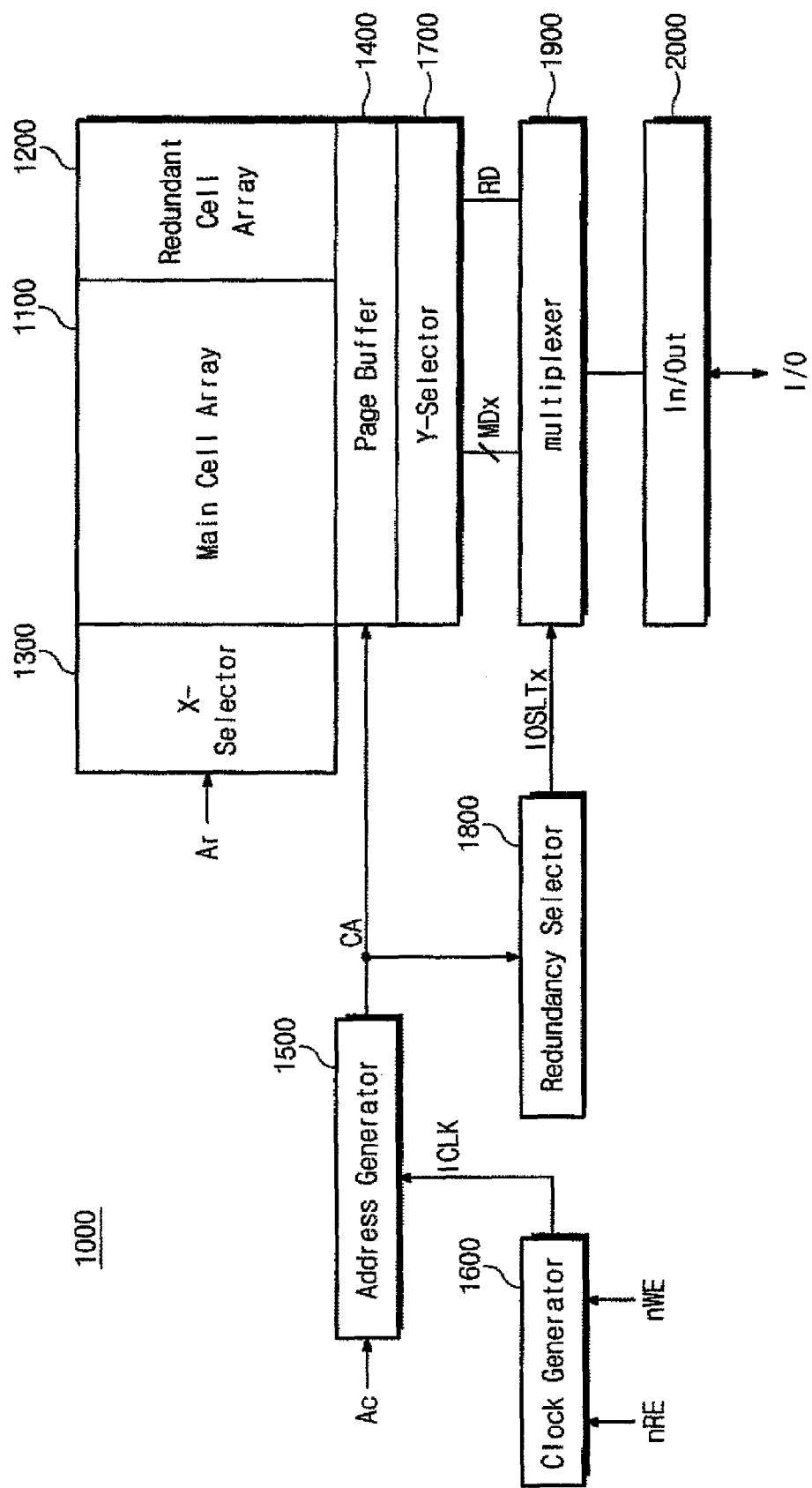
FIG. 1 is a block diagram of a non-volatile memory device according to the present disclosure.

A non-volatile memory device 100 according to the disclosed methods and systems is illustrated in FIG. 1. Prior to description of the non-volatile memory device 100, it is noted that the non-volatile memory device 100 can store data such as boot code and support a boot load function for outputting boot code data to an external device at power-up.

Referring to FIG. 1, the non-volatile memory device 100 includes a main cell array 1100, a redundant cell array 1200, a row selector circuit 1300, a page buffer circuit 1400, an address generator circuit 1500, an internal clock generator circuit 1600, a column selector circuit 1700, a redundancy selector circuit 1800, a multiplexer circuit 1900, and an input/output circuit (I/O circuit) 2000. The main cell array 1100 and the redundant cell array 1200 together constitute a memory cell array.

The main cell array 1100 includes memory cells arranged in a matrix of rows (i.e., wordlines) and columns (i.e., bitlines). Similarly, the redundant cell array 1200 includes memory cells arranged in a matrix of rows (i.e., wordlines) and columns (i.e., bitlines). Hereinafter, the memory cells of the main cell array 1100 are referred to as "main memory cells", and the memory cells of the redundant cell array 1200 are referred to as "redundancy memory cells".

The rows of the redundant cell array 1200 are electrically connected to the rows of the main cell array 1100. When a particular row is selected, cells of the selected row include memory cells of both arrays 1100 and 1200. Note, however, that in the case where a row redundancy architecture is adapted, the rows of the redundant cell array 1200 can be electrically isolated from the rows of the main memory cell 1100.

Returning to FIG. 1, when certain memory cells of the main cell array 1100 are determined to be defective, these defective memory cells can be replaced with redundant 20 memory cells of the redundant cell array 1200. To enable this functionality, a column address relating to each defective column of memory cells, .i.e., a "defective column address", can be stored/programmed in the redundancy selector circuit 1800.

During operation, the column selector circuit 1300 can select one of the rows of the memory cell array 1100 and 1200 in response to an external row address Ar, and drive the selected row using a wordline voltage. The page buffer circuit 1400 can then read data from cells (including main and redundancy memory cells) of a row/wordline selected by the row selector circuit 1300 during a read operation and drive columns/bitlines of a memory cell array using a bitline bias voltage (e.g., a power supply voltage or ground voltage) during a program/write operation. In a case where only one row constitutes one page, the page buffer circuit 1400 may include multiple page buffers each corresponding to columns of a memory cell array.

Continuing, the internal clock generator circuit 1600 can generate an internal cock signal ICLK in response to control signals nRE and nWE. For example, when a program/write operation is desired, the internal clock generator circuit 1600 can generate signal ICLK synchronized with control signal nWE; otherwise, for a read operation, signal ICLK can be generated and synchronized with control signal nRE Contemporaneously, the address generator circuit 1500 can receive a column address Ac, and then generate an internal column addresses CA in synchronization with the internal clock signal ICLK provided by the internal clock generator circuit 1600.

The column generator circuit 1700 can then select page buffers provided by the page buffer circuit 1400 in response to a column address CA provided by the address generator circuit 1500. For example, the column generator circuit 1700 can select a part of a page buffers corresponding to the main cell array 1100 and a part of a page buffers corresponding to the redundant cell array 1200.

As mentioned above, the redundancy selector circuit 1800 can be configured to store one or more defective column addresses relating to defective columns of the main cell array 1100—presumably before normal operation. After this configuration, the redundancy selector circuit 1800 can receive a column address provided by the address generator circuit 1500, and detect whether the received column address matches one of the stored defective column addresses. When the received column address matches one of the stored defective column addresses, the redundancy selector circuit 1800 can activate one of input/output selection signals IOSLTx (x=0–i).

Continuing, the multiplexer circuit 1900 can receive data bits MDx from selected page buffers of the main cell array 1100 (hereinafter, the data bits being referred to as "main data bits") and a data bit RD from a selected page buffer (or selected page buffers) of the redundant cell array 1200 (hereinafter, the data bit being referred to as "redundant data bit"). The multiplexer circuit 1900 can then selectively output the received data bits MDx and RD as a function of the input/output selection signals IOSLT0-IOSLTi. For example, when the input/output selection signals IOSLT0-IOSLTi are all deactivated, the multiplexer 1900 can output only main data bits MDx.

In an exemplary embodiment, the number of input/output selection signals IOSLT0-IOSLTi can be equal to that of main data bits selected by the column selector circuit 1700.

Figure 4:
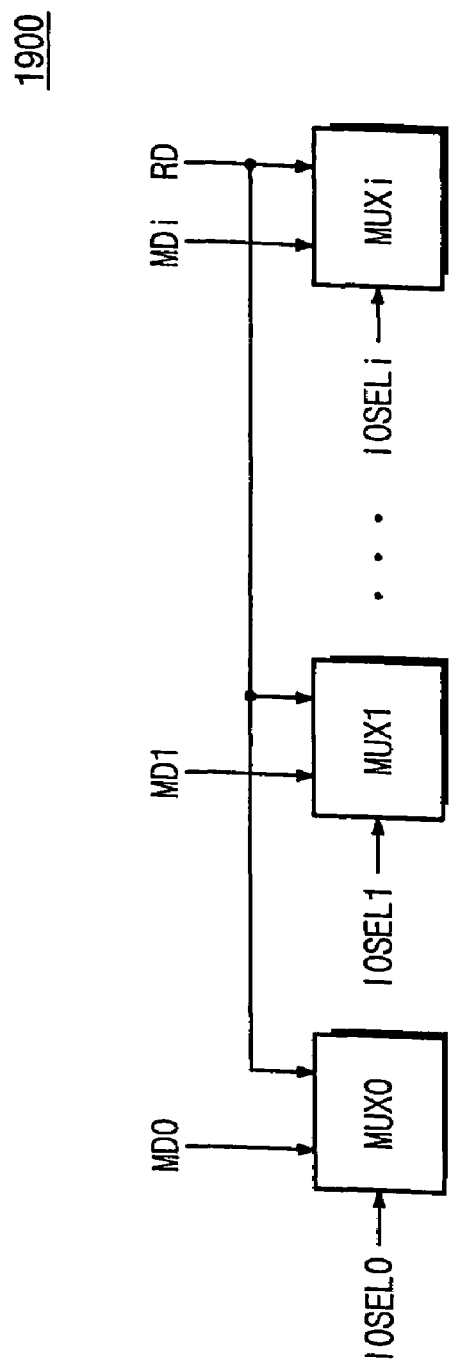
FIG. 4 is a block diagram of a multiplexer circuit illustrated in FIG. 1.

As illustrated in FIG. 4, the multiplexer circuit 1900 can include a plurality of multiplexers MUX0-MUXi, each of which can be controlled by a respective input/output selection signal IOSLT0-IOSLTi and receive a respective main data bit MD0-MDi. A single redundant data bit RD is provided to all of the multiplexers MUX0-MUXi.

In operation, when one of the input/output selection signals IOSLT0-IOSLTi is activated, the multiplexer 1900 can select the redundant data bit RD instead of one of main data bits MD0-MDi as a function of the activated selection signal IOSLT0-IOSLTi. Afterwards, the multiplexer circuit 1900 can provide as an output all of the main data bits—except for the redundant data bit replacing a particular (presumably defective) main data bit. As shown in FIG. 1, the data bits output through the multiplexer circuit 1900 can be provided to the outside through the I/O circuit 2000.

Similarly, in a program/write operation, the multiplexer circuit 1900 can select one of input data bits as a redundant data bit depending on whether one of the I/O selection signals IOSLT0-IOSLTi is activated, and the selected data bit may be stored in a page buffer of the redundant cell array 1200 through the column selector circuit 1700.

Figure 2:
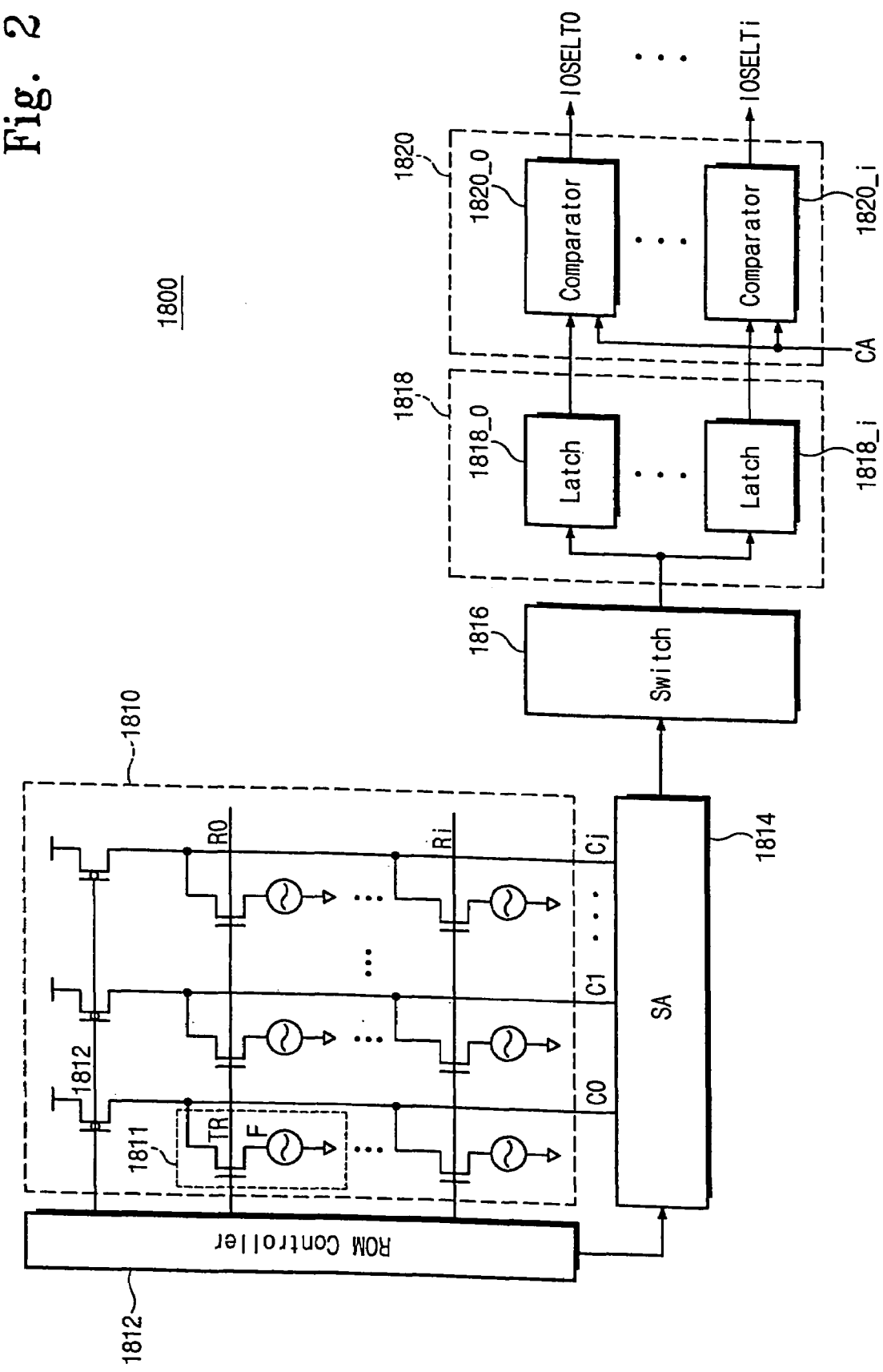
FIG. 2 is a block diagram of a redundancy selector circuit illustrated in FIG. 1.
Figure 3:
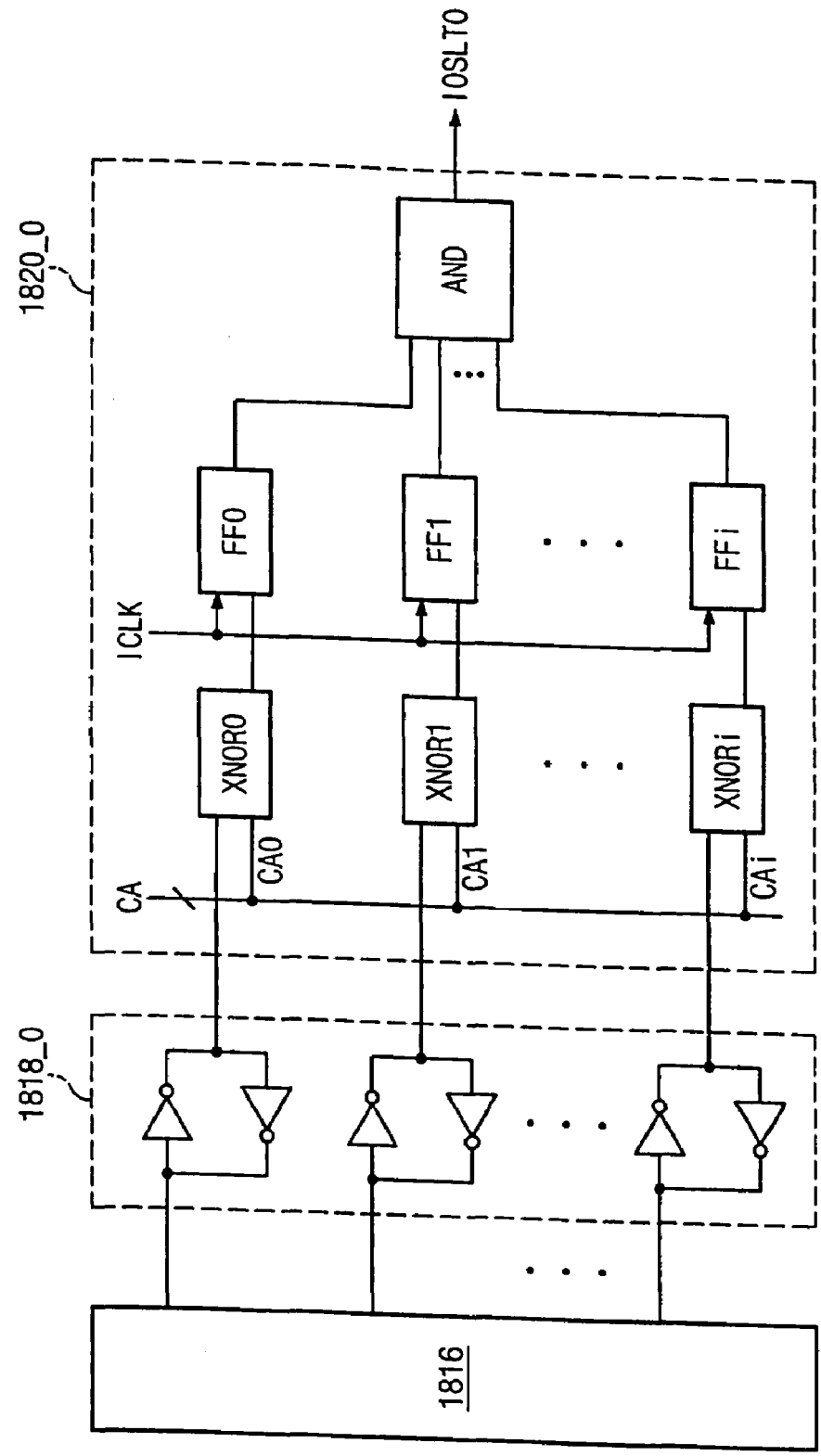
FIG. 3 is a circuit diagram of a latch block and a comparator block illustrated in FIG. 2.

FIG. 2 is a block diagram of the redundancy selector circuit illustrated in FIG. 1, and FIG. 3 is a circuit diagram of a latch block and a comparator block illustrated in FIG. 2.

Referring to FIG. 2, the redundancy selector circuit 1800 includes a ROM cell array 1810 for storing defective addresses. The ROM cell array 1810 includes a plurality of ROM cells 1811 arranged in a matrix of rows R0-Ri and columns C0-Cj. Each of the ROM cells 1811 includes one NMOS transistor TR and one fuse F to store a logical '1' or '0' depending on whether or not the respective fuse F is cut. For the present example, when the fuse F is cut, a column connected to a ROM cell is maintained at a precharge level (logic high level); when the fuse F is not cut, a column connected to a ROM cell is grounded.

For the convenience of description, it is assumed that a non-volatile memory device according to the disclosed methods and systems can adopt a column redundancy architecture. Under this assumption, the number of rows R0-Ri is equal to the number of columns such that defective columns of the main cell array 1100 can be replaced using the redundant cell array 1200. A PMOS transistor 1812 is coupled between one end of each column and a power supply voltage. The PMOS transistor 1812, which is controlled by a ROM control block 1812, can precharge the columns C0-Cj.

In power-up operation, the ROM control block 1812 can activate the PMOS transistors 1812 for a predetermined time to precharge the columns C0-Cj using a power supply voltage. After the columns C0-Cj are precharged, the ROM control block 1812 can control the ROM cell array 1810 to sequentially select the rows R0-Rj . Whenever each of the rows R0-Rj is selected, a sense amplifier block 1814 can be controlled by the R0M control block 1812 to sense voltage levels of the columns R0-Rj. Note that values sensed when the rows are selected indicate respective column addresses. Next, a switch block 1816 can be controlled by the ROM control block 1812 to transfer data bits (i.e., a defective address) output from the sense amplifier block 1814 as each row is selected to a latch block 1818. In turn, the latch block 1818 can latch the data bits (representing one or more defective address) transferred through the switch block 1816 using plurality of latch circuits 1818_0-1818_i. Note that in various embodiments, the number of the latch circuits 1818_0-1818_i can be equal to that of the rows R0-Rj of the ROM cell array 1810. Also note that a first latch circuit 1818_0 can latch a first set of data bits (i.e., a first defective address) transferred through the switch block 1816 when the row R0 is selected, and a second latch circuit 1810_1 can latch a second set of data bits (i.e., a second defective address) transferred through the switch block 1816 when the row R1 is selected and so on. Accordingly, as each row is serially selected, defective addresses can be sequentially stored in the latch block 1818 (either by parallel or serial transfer).

By transferring defective address information to the latch block 1818 in advance of normal operation, the time required for reading a defective column address at memory access following the power-up is reduced. Therefore, the redundancy selector circuit 1800 can prevent read/program errors resulting from an increase in operating speed, and reliability of the non-volatile memory device of the present disclosure is enhanced.

With the appropriate defective address data in the address block 1818, the comparator block 1820 can detect whether an address, which is input whenever a column address CA is input from the address generator circuit 1500, matches one of the addresses stored in the latch block 1818. The comparator block 1820 can activate one of the input/output selection signals (I/O selection signals) IOSLT0-IOSLTi according to the detection result. As shown in FIG. 2, the comparator block 1820 includes a plurality of comparator 1820_0-1820_i, and as shown in FIG. 3, each of the comparators 1820_0-1820_i can include XNOR gates, flip-flops, and an AND gate. The XNOR gates correspond to latches LAT0-LATi of the latch circuit 1818_0, respectively.

In operation, each of the XNOR gates can receive a respective address bit and as well as a corresponding bit of a defective address latch, and compare whether the received bits match one another. The comparison result is provided as an input of the AND gate through a flip-flip operating in synchronization with an internal clock signal ICLK. The AND gate activates a corresponding I/O selection signal IOSLT0 only when all input values match one another.

As described above, defective addresses held in the ROM cell array 1810 can be transferred (during an initial boot load period) to the latch block 1818—optionally by means of a serial transfer. After the boot load period, an address input during a normal read/program operation can be compared with the defective addresses stored in the latch block 1818. Accordingly, replacing a defective data cell with a redundant data cell may be conducted smoothly irrespective of an operating speed of the memory device.

An operation of the non-volatile memory device according to the disclosed methods and systems will now be described below in detail. For the convenience of the description, it is assumed that the subject non-volatile memory device has a column redundancy architecture. Nevertheless, it is apparent to those skilled in the art that the non-volatile memory device may similarly adopt a row redundancy architecture.

Prior to normal operation, the subject non-volatile memory device 1000, the non-volatile memory device 1000 can be tested at the wafer level to detect whether defective cells exist in the main cell array 1100. When defective cells exist in the main cell array 1100, column addresses relating to the defective cells are programmed to the redundancy selector circuit 1800—optionally by selectively cutting fuses of the ROM cell array 1810 incorporated within the redundancy selector circuit 1800.

When power is initially supplied to the non-volatile memory device 1000, a boot code stored in the non-volatile memory device 1000 can be output to an external device. At the same time, the ROM cell control block 1812 can control the ROM cell array 1810 and sense amplifier block 1814 to read defective addresses stored in the ROM cell array 1810.

More specifically, the ROM control block 1812 can activate PMOS transistors 1812 for a predetermined time to precharge columns C0-Cj using a power supply voltage. After the columns C0-Cj are precharged, the ROM control block 1812 can control the ROM cell array 1810 to sequentially select the rows C0-Cj. The ROM control block 1812 can then control the sense amplifier block 1814 to sense voltage levels of the columns C0-Cj whenever each of rows R0-Rj is selected, and the resultant sensed bits (which can represent defective addresses) can be sent to the switch block 1816.

In turn, the switch block 1816, which can be controlled by the ROM control block 1812, can serially transfer the sensed data bits to the latch block 1818, which in turn can latch the transferred data bits to provide one or more defective addresses for later comparison.

Next, normal read and program/write operations can be conducted.

In a case where a read operation is conducted, the page buffer circuit 1400 can read/receive data stored in main and redundant memory cells of a selected row. Once the data is received by the page buffer circuit 1400, the received data can be passed through the column selector circuit 1700, the multiplexer circuit 1900 and the I/O circuit 2000.

During the read operation, the address generator circuit 1500 can receive a column address input with a read command. Next, the column address input can be synchronized with an internal clock signal ICLK to sequentially generate an internal column address. The redundancy selector circuit 1800 can then detect whether an internal column address generated from the address generator circuit 1500 at each cycle of the internal clock signal ICLK represents a defective column address. That is, the comparator block 1820 can detect whether an input internal column address CA matches one of the column addresses loaded on the latch block 1818 at power-up.

If there is no match, I/O selection signals IOSLT0-IOSLTi are maintained at an inactive state, and all main data bits selected by a column selector circuit 1700 can be transferred to the I/O circuit 2000 through the multiplexer circuit 1900.

On the other hand, if there is a match, the comparator block 1820 can activate one of the I/O selection signals IOSLT0-IOSLTi, which in turn can cause the multiplexer circuit 1900 to replace a (presumably defective) main data bit with a redundant data bit, and the combination of main and replacement data bits are sent to the I/O circuit 2000.

As previously stated, defective addresses read out from the ROM cell array 1810 at power-up can be stored in the latch block 1818. After the power-up, an address input in a normal read/program operation is compared with the defective addresses stored in the latch block 1818. Thus, an operation of converting a defective one of input/output data bits into a redundant data bit may be conducted smoothly irrespective of an operating speed of the memory device.

Although the disclosed methods and systems have been described in connection with the embodiment of the disclosed methods and systems illustrated in the accompanying drawings, it is not limited thereto. It will be apparent to those skilled in the art that various substitution, modifications and changes may be thereto without departing from the scope and spirit of the disclosure.

What is claimed is:

1. A redundancy selector circuit for use in a flash memory device, the redundancy selector circuit comprising:
   a ROM cell array that includes a plurality of ROM cells arranged in a matrix of rows and columns for storing defective addresses of the flash memory device;
   a ROM controller for sequentially selecting rows of the ROM cell array at power-up;
   a sense amplifier block for sensing data bits from ROM cells selected by the ROM controller, wherein the data bits represent one or more defective addresses of the flash memory device;
   a latch block for serially receiving the defective address data bits sensed by the sense amplifier block through a switch circuit, and subsequently latching the serially input defective address data bits; and
   a comparator block for detecting whether an address input in a normal operation of the flash memory device matches one of the one or more defective addresses stored in the latch block.

2. The redundancy selector circuit of claim 1, wherein the number of the rows of the ROM cell array is equal to that of a number of redundant columns provided to the flash memory device.

3. The redundancy selector circuit of claim 2, wherein the number of the columns of the ROM cell array is equal to that of the number of bits of an address for addressing a defective column.

4. The redundancy selector circuit of claim 1, wherein each of the ROM cells comprises:
   a fuse;
   a transistor having a gate connected to a corresponding row;
   a drain connected to a corresponding column; and
   a source grounded through the fuse.

5. The redundancy selector circuit of claim 1, wherein the ROM cell array further comprises a PMOS transistor coupled between one end of each respective columns and a power supply voltage, the PMOS transistor being controlled by the ROM controller to precharge the columns at power-up.

6. A redundancy selector circuit for use in a non-volatile memory device, the redundancy selector circuit comprising:
   a ROM cell array that includes a plurality of ROM cells arranged in a matrix of rows and columns for storing defective addresses of the non-volatile memory device;
   a ROM controller for sequentially selecting rows of the ROM cell array at power-up;
   a sense amplifier block for sensing data bits from ROM cells selected by the ROM controller, wherein the data bits represent one or more defective addresses of the non-volatile memory device;
   a latch block for receiving the defective address data bits sensed by the sense amplifier block through a switch circuit, and subsequently latching the input defective address data bits; and
   a comparator block for detecting whether an address input in a normal operation of the non-volatile memory device matches one of the one or more defective addresses stored in the latch block.

7. The redundancy selector circuit of claim 6, wherein as the rows are sequentially selected, the defective addresses of the ROM cell array are transferred to the latch block through the sense amplifier block by means of serial transfer.

* * * * *